(12) United States Patent
Yeo et al.

(10) Patent No.: US 6,534,788 B1
(45) Date of Patent: Mar. 18, 2003

(54) THIN FILM TRANSISTOR HAVING DUAL GATE STRUCTURE AND A FABRICATING METHOD THEREOF

(75) Inventors: Ju-Cheon Yeo, Anyang-shi (KR); Hong-Seok Choi, Kunpo-shi (KR); Yong-Min Ha, Anyang-shi (KR); Sang-Gul Lee, Seoul (KR)

(73) Assignee: LG Philips LCD Co., LTD (KR)

( * ) Notice: Subject to any disclaimer, the term of this patent is extended or adjusted under 35 U.S.C. 154(b) by 0 days.

(21) Appl. No.: 09/364,823

(22) Filed: Jul. 30, 1999

(30) Foreign Application Priority Data

Jul. 30, 1998 (KR) .............................. 98-30869

(51) Int. Cl.[7] .............................................. H01L 29/12
(52) U.S. Cl. ............................................ 257/72; 257/66
(58) Field of Search ........................... 257/72, 359, 66; 349/42–47, 138–143

(56) References Cited

U.S. PATENT DOCUMENTS 5,834,797 A * 11/1998 Yamanaka .................... 257/57
6,163,352 A * 12/2000 Ichikawa et al. ............ 349/106
6,163,356 A * 12/2000 Song et al. .................. 349/152

* cited by examiner

*Primary Examiner*—Minh Loan Tran
*Assistant Examiner*—Thomas L Dickey
(74) *Attorney, Agent, or Firm*—McKenna Long & Aldridge LLP

(57) ABSTRACT

The present invention relates to a thin film transistor and a fabricating method thereof, wherein the source and drain wires are located on a substrate and a double gate structure is provided, whereby the driving capacity of on-current is improved and the degradation of a device is reduced. The TFT includes a substrate, a source electrode, a drain electrode and a lower gate electrode on the substrate, a buffer layer covering an exposed surface of the substrate as well as the source, drain and lower gate electrodes. An active layer is formed on the buffer layer, wherein a source region, a drain region, lightly-doped (LD) regions and a channel region are formed in the active layer. A gate insulating layer is formed on the channel and LD regions. An upper gate electrode is then formed on the gate insulating layer over the channel region. A passivation layer then covers the upper gate electrode. A plurality of contact holes are formed in the buffer and passivation layers, wherein the contact holes expose the source and drain electrodes and the source and drain regions. A first interconnection wire connects the source electrode to the source region. A second interconnection wire connects the drain electrode to the drain region.

23 Claims, 9 Drawing Sheets

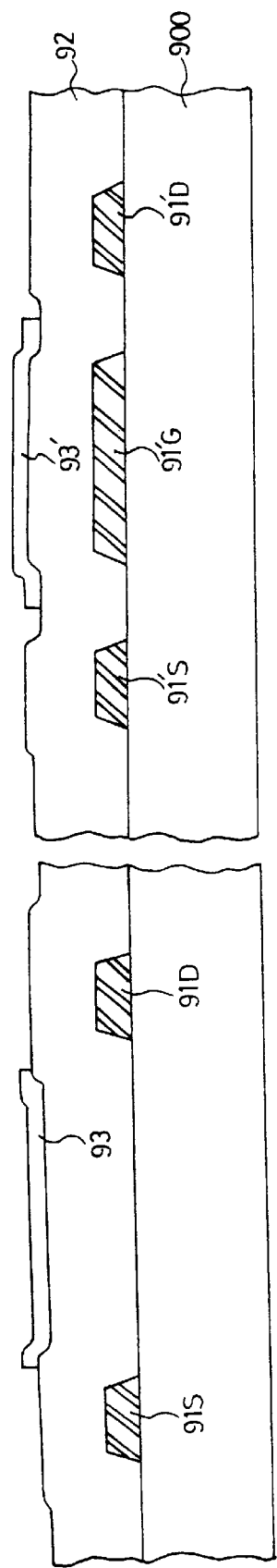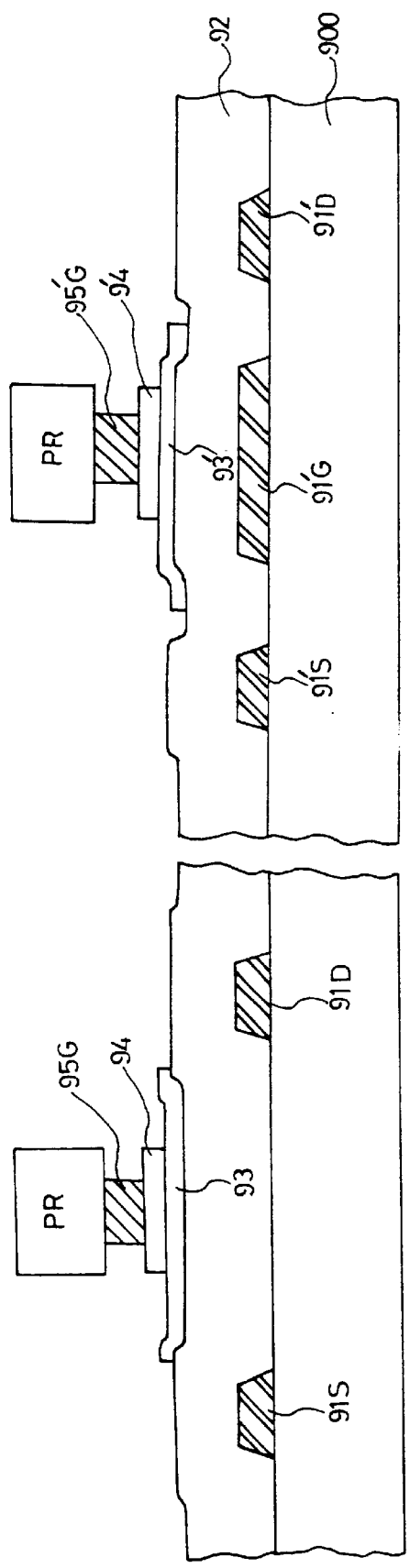
FIG.9A
FIG.9B

THIN FILM TRANSISTOR HAVING DUAL GATE STRUCTURE AND A FABRICATING METHOD THEREOF

This application claims the benefit of Korean Patent Application No. 98-30869, filed on Jul. 30, 1998, which is hereby incorporated by reference.

BACKGROUND OF THE INVENTION

1. Field of Invention

The present invention relates to a thin film transistor and a fabricating method thereof wherein the source and drain wires are located at the lowest layer on a substrate and a double gate structure is provided.

2. Discussion of Related Art

Compared to an amorphous silicon thin film transistor (hereinafter abbreviated TFT), a polycrystalline silicon TFT has a high mobility of electrons and holes and can be used as a CMOS TFT. Accordingly, a liquid crystal display (hereinafter abbreviated LCD) having polycrystalline silicon TFTs has a structure such that both a driver and a pixel array are formed on a glass substrate.

When polycrystalline silicon TFTs are formed in a driver, an LCD permits switching operations at a fast frequency due to the characteristics of polycrystalline silicon. Yet, when polycrystalline silicon TFTs are fabricated on a pixel array in an LCD, the characteristics of the image deteriorates due to the high drain current during off-states due to the characteristics of polycrystalline silicon.

More recently, in order to reduce the off-current in a pixel array to a proper level, TFTs having a lightly doped drain (LDD) structure, an offset structure or the like have been used.

FIG. 1 shows a schematic cross-sectional view of a TFT according to a related art. Referring to FIG. 1, source and drain wires are formed on a substrate, a buffer layer for crystallizing silicon covers the source and drain wires and an exposed surface, and a TFT of a coplanar type is formed on an insulating layer. This structure is called a buried bus coplanar (BBC) structure.

Source and drain electrodes 11S and 11D are formed on an insulated substrate 100, and a first insulating layer 12 covers an exposed surface of the substrate. A channel region 13C, LDD regions 13L and source and drain regions 13S and 13D, which are formed with polycrystalline silicon, are formed on predetermined areas of the first insulating layer 12.

A gate insulating layer 14 and a gate electrode 15 are formed on the active layer 13. The gate insulating layer 14 on the active layer 13 overlaps the LDD regions 13L and the channel region 13C, and the gate electrode 15 on the gate insulating layer 14 lies over the channel region 13C of the active layer 13.

A second insulating layer 16 covers the above structure on the substrate. Contact holes exposing the source and drain electrodes 11S and 11D on the insulated substrate 100 and the source and drain regions 13S and 13D in the active layer are formed in the second insulating layer 16. A first interconnection wire 17-1 connecting the source electrode to the source region 13S and a second interconnection wire 17-2 connecting the drain electrode 11D to the drain region 13D are formed on the second insulating layer 16.

When a TFT having the above structure is applied to the fabrication of an LCD, TFTs located in the pixel array and the circuit part are fabricated simultaneously. Thus, structures of TFTs in the circuit part may be fabricated to have LDD regions of the same quality as those in the pixel array.

However, when TFTs of the above structure are used for the devices in a driver, the on-current is reduced due to the location of LDD regions in the active layer. Accordingly, operation speed of the driver becomes slower as the current driving capacity of the driver drops.

Moreover, as a high voltage between the source and the drain is applied to TFTs in a driver to generate a high electrical field in a drain region, degradation is caused by increasing numbers of hot carriers. Thus, device characteristics deteriorate.

SUMMARY OF THE INVENTION

Accordingly, the present invention is directed to a thin film transistor and a fabricating method thereof that substantially obviates one or more of the problems due to limitations and disadvantages of the related art.

The object of the present invention is to provide a thin film transistor and a fabricating method thereof, wherein the transistor has a BBC structure, which means that source and drain electrodes are on a substrate, and lightly-doped (LD) regions of low resistance and improved current driving capacity reduces the degradation of a device.

Another object of the present invention is to provide an liquid crystal display and a fabricating method thereof, wherein a driver uses TFTs which have improved current driving capacity and reduced degradation of devices and a pixel array uses TFTs where the off-current is reduced. Accordingly, the driver has a fast operating speed and the pixel array has excellent device characteristics.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes a substrate, a source electrode, a drain electrode and a lower gate electrode on the substrate, a buffer layer covering an exposed surface of the substrate including the source, drain and lower gate electrodes, an active layer on the buffer layer wherein a source region, a drain region, LD regions and a channel region are formed in the active layer, a gate insulating layer on the channel and LD regions, an upper gate electrode on the gate insulating layer over the channel region, a passivation layer covering the upper gate electrode, a plurality of contact holes in the buffer and passivation layers, wherein the contact holes expose the source and drain electrodes and the source and drain regions, a first interconnection wire connecting the source electrode to the source region, and a second interconnection wire connecting the drain electrode to the drain region.

In one embodiment, the present invention includes a substrate, a source electrode and a drain electrode on the substrate, a buffer layer covering an exposed surface of the substrate including the source and drain electrodes, an active layer on the buffer layer wherein a source region, a drain region, LD regions and a channel region are formed in the active layer and wherein the drain region and the LDD region inside the drain region are overlapped with the drain electrode, a gate insulating layer on the channel and LD regions, an upper gate electrode on the gate insulating layer over the channel region, a passivation layer covering the upper gate electrode, a plurality of contact holes in the buffer and passivation layers wherein the contact holes expose the source and drain electrodes and the source and drain regions, a first interconnection wire connecting the source electrode to the source region, and a second interconnection wire connecting the drain electrode to the drain region.

In another embodiment, the present invention includes the steps of forming a source electrode, a drain electrode and a lower gate electrode on a substrate, forming a buffer layer on the substrate as well as on the source, drain and lower gate electrodes, forming an active layer on the buffer layer over the lower gate electrode, depositing a gate insulating layer and a conductive layer on an exposed surface of the surface as well as on the active layer, defining a photoresist pattern for a gate formation on the conductive layer, forming an upper gate electrode by overetching the conductive layer using the photoresist pattern as a mask, anisotropically etching the gate insulating layer using the photoresist pattern as a mask, removing the photoresist pattern, forming a source region, a drain region and LD regions by doping the active layer with impurities using the upper gate electrode and the gate insulating layer as masks, forming a passivation layer covering an exposed surface of the substrate including the upper gate electrode, forming a plurality of contact holes in the buffer and passivation layers, wherein the contact holes expose the source and drain electrodes and the source and drain regions, and forming a first interconnection wire connecting the source electrode to the source region and a second interconnection wire connecting the drain electrode to the drain region.

In another embodiment, the present invention includes the steps of forming a source electrode and a drain electrode on a substrate, forming a buffer layer covering the substrate as well as on the source, drain and lower gate electrodes, forming an active layer on the buffer layer overlapped with the lower gate electrode, depositing a gate insulating layer and a conductive layer each on an exposed surface of the surface as well as on the active layer, defining a photoresist pattern for a gate formation on the conductive layer, forming a gate electrode by overetching the conductive layer using the photoresist pattern as a mask, anisotropically etching the gate insulating layer using the photoresist pattern as a mask, removing the photoresist pattern, forming a source region, a first LD region inside the source region, a drain region overlapped with the drain electrode and a second LD region by doping the active layer with impurities using the gate electrode and the remaining gate insulating layer as masks, forming a passivation layer covering an exposed surface of the substrate as well as the gate electrode, forming a plurality of contact holes in the buffer and passivation layers, wherein the contact holes expose the source and drain electrodes and the source and drain regions, and forming a first interconnection wire connecting the source electrode to the source region and a second interconnection wire connecting the drain electrode to the drain region.

In another embodiment, the present invention includes a substrate, a first thin film transistor, the first thin film transistor further comprising: a source electrode and a drain electrode on the substrate; a buffer layer covering an exposed surface of the substrate as well as the source and drain electrodes; an active layer on the buffer layer, wherein a source region, a drain region, LD regions and a channel region are formed in the active layer; a gate insulating layer on the channel and LD regions; and a gate electrode on the gate insulating layer over the channel region, a second thin film transistor, the second thin film transistor further comprising: a source electrode, a drain electrode and a lower gate electrode on the substrate; a buffer layer covering an exposed surface of the substrate as well as the source, drain and lower gate electrodes; an active layer on a predetermined portion of the buffer layer, wherein a source region, a drain region, LD regions and a channel region are formed in the active layer; a gate insulating layer on the channel and LD regions in the active layer; and an upper gate electrode on the gate insulating layer over the channel region, a passivation layer covering the first and second thin film transistors, a plurality of contact holes exposing the source and drain electrodes and the source and drain regions in the first and second thin film transistors, a pixel electrode connecting the drain electrode to the drain region of the first thin film transistor, a first interconnection wire connecting the source electrode to the source region in the second thin film transistor, and a second interconnection wire connecting the drain electrode to the drain region.

In another embodiment, the present invention includes the steps of defining a pixel array and a driver on a substrate, forming a source electrode and a drain electrode on the substrate in the pixel array and forming a source electrode, a drain electrode and a lower gate electrode on the substrate in the driver, forming a buffer layer covering an exposed surface of the substrate as well as the lower gate electrode, forming an active layer of the pixel array and an active layer of the driver on the buffer layer, depositing a gate insulating layer and a conductive layer in a single pump down on an exposed surface of the substrate as well as on the active layers, defining a photoresist pattern for a gate formation on the conductive layer, forming a gate electrode of the pixel array and an upper gate electrode of the driver by overetching the conductive layer using the photoresist pattern as a mask, anisotropically etching the gate insulating layer using the photoresist pattern as a mask, removing the photoresist pattern, forming source regions, LD regions, drain regions by doping the active layers in the pixel array and the driver with impurities using the gate electrode of the pixel array, the upper gate electrode of the driver and the remaining gate insulating layer as masks, forming a passivation layer covering an exposed surface of the substrate as well as the gate electrode of the pixel array and the upper gate electrode of the driver, forming a plurality of contact holes in the buffer and passivation layers, wherein the contact holes expose the source and drain electrodes of the pixel array and the source and drain electrodes and the source and drain regions of the driver, and forming a pixel electrode connecting the drain electrode to the drain region, a first interconnection wire connecting the source electrode to the source region of the driver and a second interconnection wire connecting the drain electrode to the drain region.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention.

In the drawings:

FIGS. 9A to 9D show cross-sectional views of certain fabrication stages of a liquid crystal display according to the present invention.

DETAILED DESCRIPTION OF PREFERRED EMBODIMENTS

Reference will now be made in detail to the preferred embodiments of the present invention, examples of which are illustrated in the accompanying drawings. Double gates are adopted by a TFT having LD regions of a BBC structure according to the present invention.

Figure 1:
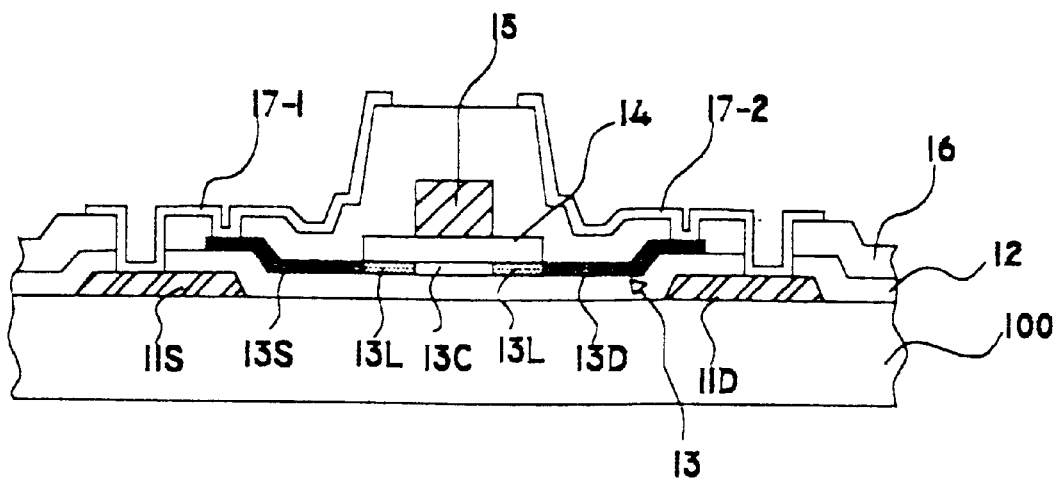
FIG. 1 shows a schematic cross-sectional view of a TFT according to the related art.
Figure 2:
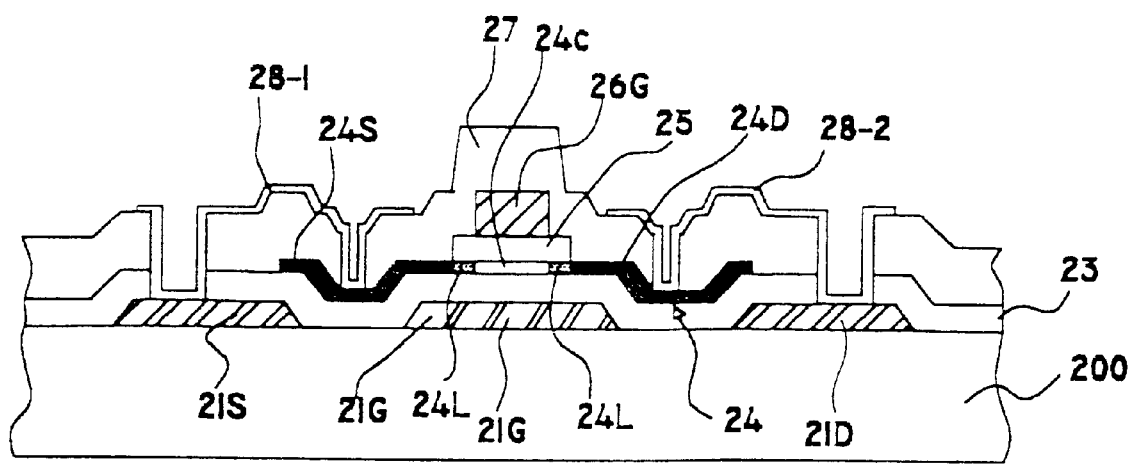
FIG. 2 shows a cross-sectional view of a TFT according to a first embodiment of the present invention.

FIG. 2 shows a cross-sectional view of a TFT according to a first embodiment of the present invention. To achieve the objectives of the present invention, the TFT includes the double gates of a BBC structure.

Referring to FIG. 2, a lower gate electrode 21G, source and drain electrodes 21 S and 21D are formed on an insulated substrate 200, and a buffer layer 23 covers exposed surfaces of the substrate and the electrodes. A channel region 24C, LD regions 24L and source and drain regions 24S and 24D, which are formed from polycrystalline silicon, are formed on predetermined parts of the buffer layer 23 which functions as a gate insulating layer.

A gate insulating layer 25 and an upper gate electrode 26 are formed on the active layer 24. The gate insulating layer 25 is overlapped with the LD regions 24L and the channel region 24C in the active layer, while the upper gate electrode 26G on the gate insulating layer 25 lies over the channel region 24C in the active layer 24. The gate insulating layer 25 functions as an upper gate insulating layer.

A passivation layer 27 covers the above structure of the substrate. Contact holes exposing the source and drain electrodes 21S and 21D on the insulated substrate 200 and the source and drain regions 24S and 24D in the active layer are formed through the passivation layer 27. On the passivation layer 27, a first interconnection wire 28-1 connecting the source electrode 21S to the source region 24S and a second interconnection wire 28-2 connecting the drain electrode 21D and to the drain region 24D are formed.

In the above structure of the present invention, the lower gate electrode 21G is overlapped with the lower parts of the channel region and the LD regions and is designed to operate at the same voltage as the upper gate electrode 26G. When a predetermined voltage is applied to the upper and lower electrodes of the TFT having the structure of the present invention, the on-current is increased by reducing the resistance in the LD regions where carriers are induced by the lower gate electrode.

Moreover, the electrical field around the drain moves downward because a channel is formed in the lower part of the active layer by the lower gate electrode 21G. Therefore, electric field at the interface between the active layer and the gate insulating layer, i.e., the upper gate insulating layer, may be weakened.

Figure 3A:
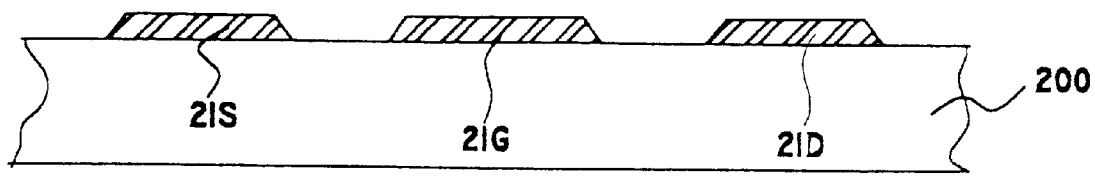
FIGS. 3A to 3E are cross-sectional views of the fabrication of the embodiment of FIG. 2.

FIG. 3A to FIG. 3E are cross-sectional views of the fabricating stages of the embodiment of FIG. 2. Referring to FIG. 3A, a first conductive layer is deposited on a substrate 200 by a conventional method. Source, drain and lower gate electrodes 21S, 21D and 21G are formed by patterning the first conductive layer by photolithography.

Figure 3B:
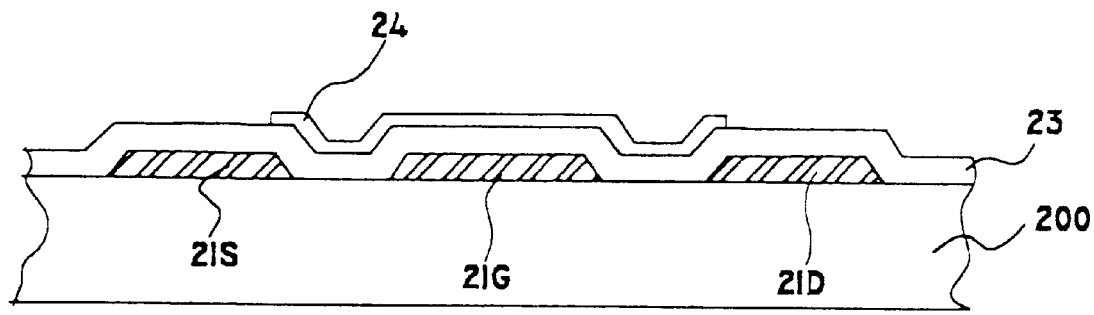

Referring to FIG. 3B, a buffer layer 23 is deposited on the exposed surface of the substrate and electrodes by a conventional method of deposition. In this case, the buffer layer 23 in a TFT having a BBC structure is formed to electrically insulate the source, drain, lower gate electrodes 21S, 21D and 21G from other elements formed over the electrodes.

An amorphous silicon layer is deposited on the exposed buffer layer 23. The amorphous layer is then crystallized by laser annealing or other suitable process known to one of ordinary skill in the art. In this case, the buffer layer prevents the silicon layer from being penetrated by impurities in the substrate 200 thereunder during the crystallization of the amorphous silicon layer and also functions to thermally insulate the substrate from the silicon layer. Therefore, it is desirable for the buffer layer 23 to be more than about 1000 angstroms thick. Next, an active layer 24 is formed on the buffer layer 23 by photolithographically patterning the crystallized silicon layer.

Figure 3C:
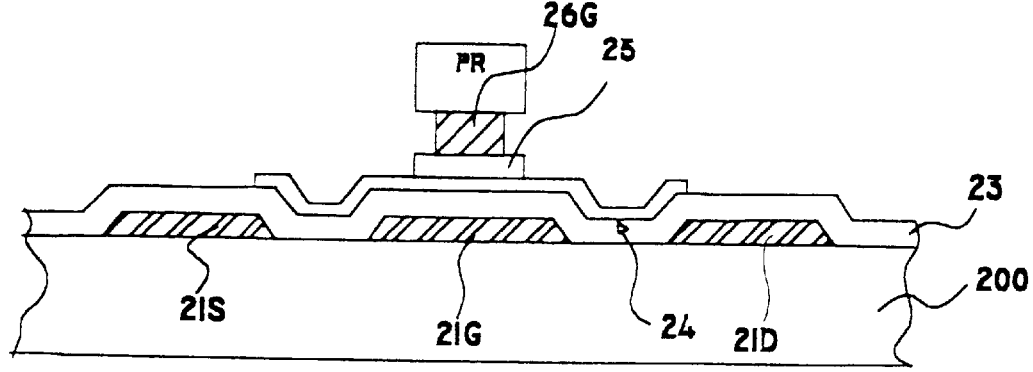

Referring to FIG. 3C, a gate insulating layer and a second conductive layer are deposited successively on the entire surface of the substrate 200. A photoresist pattern (PR) for forming an upper gate electrode is defined on the second conductive layer. Then, an upper gate electrode 26G is formed by over-etching the second conductive layer beneath the photoresist pattern, which is used as an etch mask. Then, the gate insulating layer 25 is anisotropically etched again using the photoresist pattern PR as an etch mask.

Figure 3D:
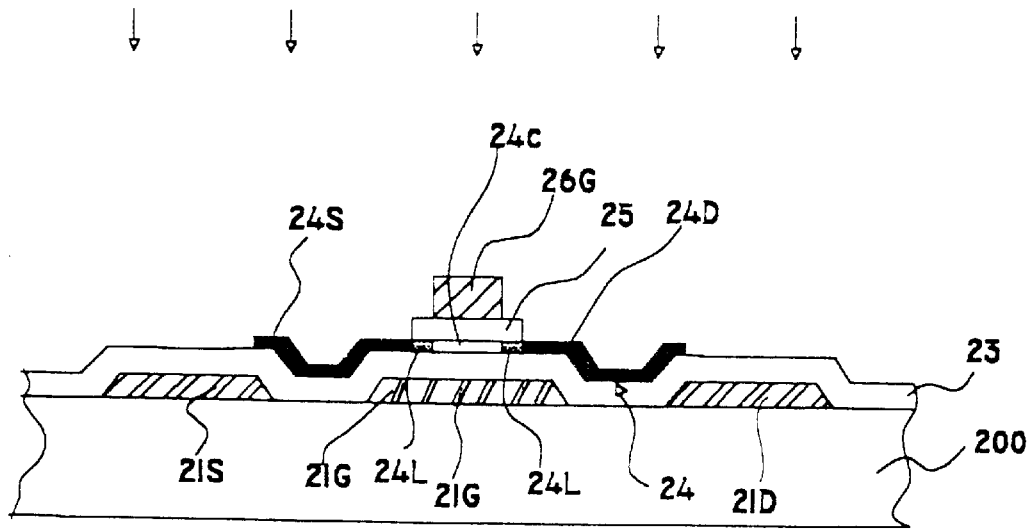

Referring to FIG. 3D, source, drain and LD regions 24S, 24D and 24L are formed simultaneously by doping the active layer 24 with n- or p-type impurities. Sizes of the LD regions in the active layer are decided by the width difference between the over-etched upper gate electrode and the gate insulating layer.

Figure 3E:
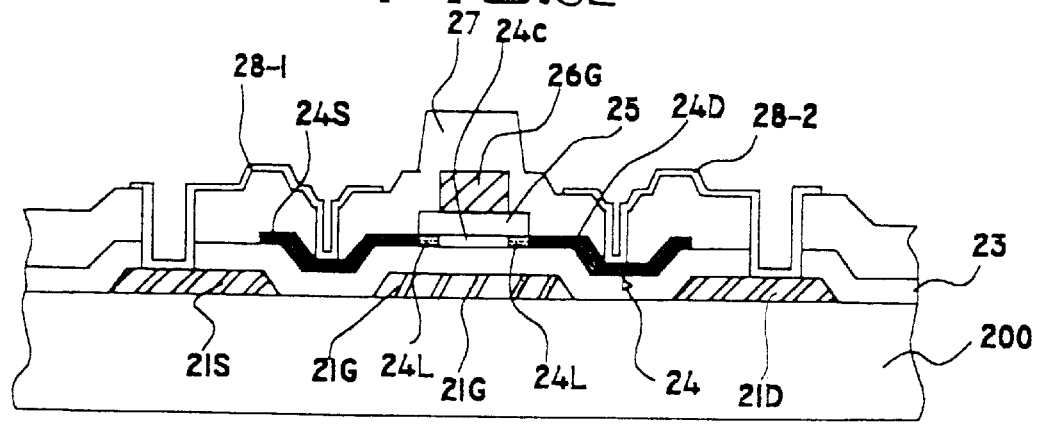

Referring to FIG. 3E, a passivation layer 27 covering the entire surface of the substrate is formed. Then, contact holes exposing the source electrode 21S, the source region 24S, the drain electrode 21D and the drain region 24D are formed by patterning and etching the gate insulating layer 23 and the passivation layer 27 by photolithography.

A third conductive layer is deposited on the entire surface of the passivation layer 27. A first interconnection wire 28-1 connecting the source electrode 21S to the source region 24S and a second interconnection wire 28-2 connecting the drain electrode 21D to the drain region 24D are formed by photolithographically etching the third conductive layer.

When used in an LCD, the second interconnection wire 28-2 may be used as a pixel electrode. Therefore, the third conductive layer may be formed with transparent substance which is electrically conductive as well as metallic.

Figure 4:
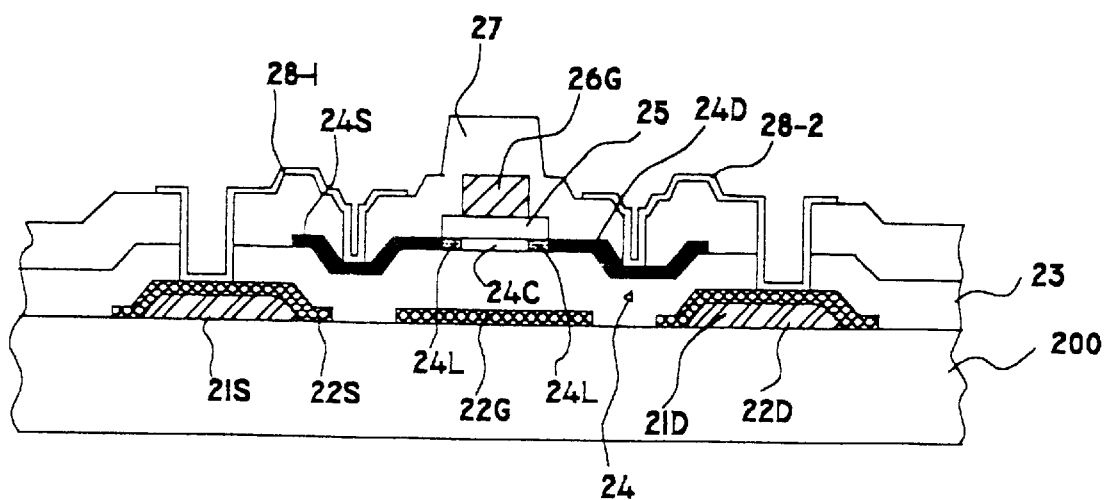
FIG. 4 shows a cross-sectional view of a TFT according to a second embodiment of the present invention.

FIG. 4 shows a cross-sectional view of a TFT according to a second embodiment of the present invention, wherein the second embodiment is a transformation of the first embodiment of the present invention.

Referring to FIG. 4, source and drain electrodes are formed with double layers on a substrate 200, the upper layer covering the lower, which is called a "clad" structure. This structure is used for source and drain electrodes which are formed with Al and have low electrical resistance.

A double-layered source electrode of the clad structure, in which the second source electrode 22S covers the first source electrode 21S, a double-layered drain electrode of the clad structure, in which the second drain electrode 22D covers the first drain electrode 21D, and a lower gate electrode 22G are formed on a substrate 200. The rest of the structure of the second embodiment is substantially similar to that of the first embodiment of the present invention, and, accordingly, the explanation will not be repeated here.

In order to form source, drain and lower gate electrodes, a first source electrode 21S and a first drain electrode 21D are formed preferably by photolithography after a first metal layer, such as an Al layer which is about 2500–3500 angstroms thick has been deposited on the substrate 200.

A second source electrode 22S covering the first source electrode 21S, a second drain electrode 22D covering the first drain electrode 21D and a lower gate electrode 22G are formed simultaneously by photolithography after a second metal layer, such as a Mo layer, which is about 4500–5500 angstroms thick has been deposited to cover the entire surface.

When electrodes having at least two layers are formed at too great a thickness on the substrate 200, it is easy for the active layer on the buffer layer 23 to be electrically open at the step region due to the step height of the buffer layer 23 formed on the electrodes. Thus, the silicon layer on the step is vulnerable to being cut off during the deposition and crystallization of an amorphous silicon layer on the buffer layer.

Accordingly, as shown in FIG. 4, it is desirable to lessen the step height of the buffer layer 23 in part by forming a single-layered lower gate electrode instead of the double-layered electrode structure used for the source and drain electrodes.

Figure 7:
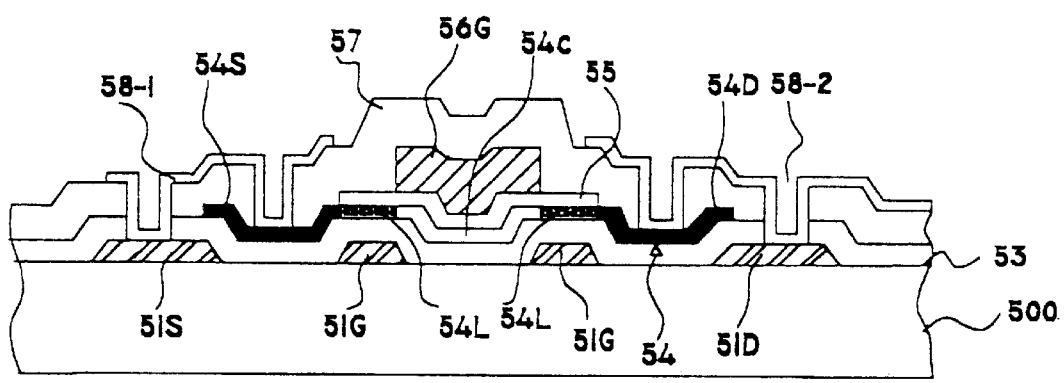
FIG. 7 shows a cross-sectional view of a TFT according to a third embodiment of the present invention.
Figure 8:
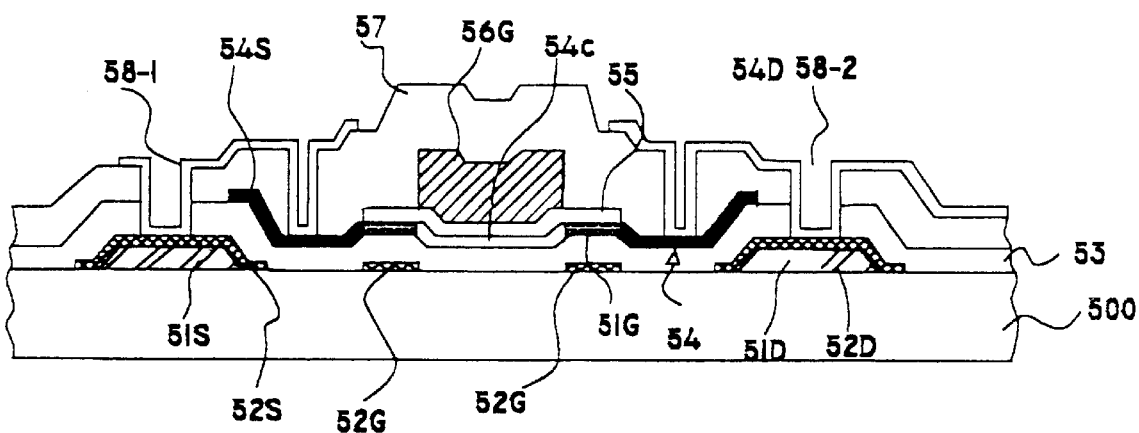
FIG. 8 shows a cross-sectional view of a TFT according to a fourth embodiment of the present invention.

FIG. 7 shows a cross-sectional view of a TFT according to a third embodiment of the present invention and FIG. 8 shows a cross-sectional view of a TFT according to a fourth embodiment of the present invention.

Referring to FIG. 7, source and drain electrodes 51S and 51D and first and second lower gate electrodes 51G and 51G' are formed on an insulated substrate 500. A buffer layer 53 covers the entire surface of the substrate. An active layer of polycrystalline silicon where source and drain regions 54S and 54D, LD regions 54L and a channel region 54C is formed on the buffer layer 53. The buffer layer 53 works as a lower gate insulating layer. The first and second lower gate electrodes 51G and 51G' are only overlapped with the LD regions 54L of the active layer.

The buffer layer 53 in a TFT of the BBC structure is formed for electrical insulation among the source, drain and lower gate electrodes 51S, 51D and 51G which are formed directly on the substrate and the rest components which are formed over the electrodes. Moreover, the buffer layer 53, during the crystallization of the amorphous silicon layer, prevents the silicon layer from being penetrated by the impurities in the substrate 500 and thermally insulates the substrate from the silicon layer.

Accordingly, it is desirable to form the buffer layer 53 at a thickness greater than 1000 angstroms.

A gate insulating layer 55 and an upper gate electrode 56G are formed on the active layer 54. The gate insulating layer 55 on the active layer 54 overlaps the LDD regions 54L and the channel region 54C, and the upper gate electrode 56G on the gate insulating layer 55 lies over the channel region 54C of the active layer. Accordingly, the gate insulating layer 55 functions as an upper gate insulating layer.

A passivation layer 57 covers the entire surface of the substrate. Contact holes exposing the source and drain electrodes 51S and 51D on the insulated substrate 500 and the source and drain regions 54S and 54D in the active layer are formed through the gate insulating layer 55 and the passivation layer 57.

A first interconnection wire 58-1 connecting the source electrode 51S to the source region 54S and a second interconnection wire 58-2 connecting the drain electrode 51D and to the drain region 54D are preferably formed on the passivation layer 57. As mentioned in the above explanation, the first and second lower gate electrodes 51G and 51G' are overlapped by the LD regions 54L of the active layer.

When a predetermined voltage is applied to the first and second lower gate electrodes, the on-current is increased by reducing the resistance in the LD regions where carriers in the source and drain regions 54S and 54D are induced to the LD regions 54L.

The above structure of the present invention is operated by connecting the lower gate electrodes 51G and 51G' to the upper gate electrode 56G and by applying the same voltage to each. When a predetermined voltage is applied to the upper and lower electrodes of the TFT having the structure of the present invention, resistance in the LD regions where carriers are induced by the lower gate electrode is reduced. Thus, operating speed of the driver is increased by increasing the on-current of the TFT.

Moreover, electrical field around the drain moves downward because a channel is formed under the active layer by the lower gate electrode. Therefore, electric field at the interface between the active layer and the gate insulating layer may be weakened so that the degradation of device characteristics by hot-carriers is inhibited.

Furthermore, parasitic capacitance is reduced by decreasing the overlapped portion between the upper and lower gate electrodes, and, therefore, the operation speed of the driver is increased.

FIG. 8 shows a cross-sectional view of a TFT according to a fourth embodiment of the present invention, which is transformed from the third embodiment of the present invention. Referring to FIG. 8, source and drain electrodes are formed with double layers on a substrate, which is the clad structure. This structure is used for source and drain electrodes which are formed with Al and have low electrical resistance.

A double-layered source electrode of the clad structure, in which the second source electrode 52S covers the first source electrode 51S, a double-layered drain electrode of the clad structure, in which the second drain electrode 52D covers the first drain electrode 21D and a lower gate electrode 52G are formed on a substrate 200. The remaining steps in the fabrication of a TFT of the fourth embodiment is substantially similar to that of the third embodiment of the present invention, and, accordingly, the explanation will not be repeated here.

In order to form source, drain and lower gate electrodes, a first source electrode 51S and a first drain electrode 51D are preferably formed by photolithography after a first metal layer, such as an Al layer which is about 2500–3500 angstroms thick has been deposited on the substrate 500.

Then, a second source electrode 52S covering the first source electrode 51S, a second drain electrode 52D covering the first drain electrode 51D and first and second lower gate electrodes 52G and 52G' are formed by photolithography after a second metal layer such as a Mo layer which is 4500–5500 angstroms thick has been deposited to cover the entire surface.

When the electrode having at least two layers are formed at too great a thickness on the substrate 500, it is easy for the active layer on the buffer layer 53 to be electrically open at the step region due to the step height of the buffer layer 53 formed on the electrodes. Accordingly, the silicon layer on the step is vulnerable to being cut off during the deposition and crystallization of an amorphous silicon layer on the buffer layer.

Accordingly, as shown in FIG. 4, it is desirable to lessen the step height of the buffer layer 53 in part by forming a single-layered lower gate electrode instead of the double-layered one used for source and drain electrodes.

Figure 5:
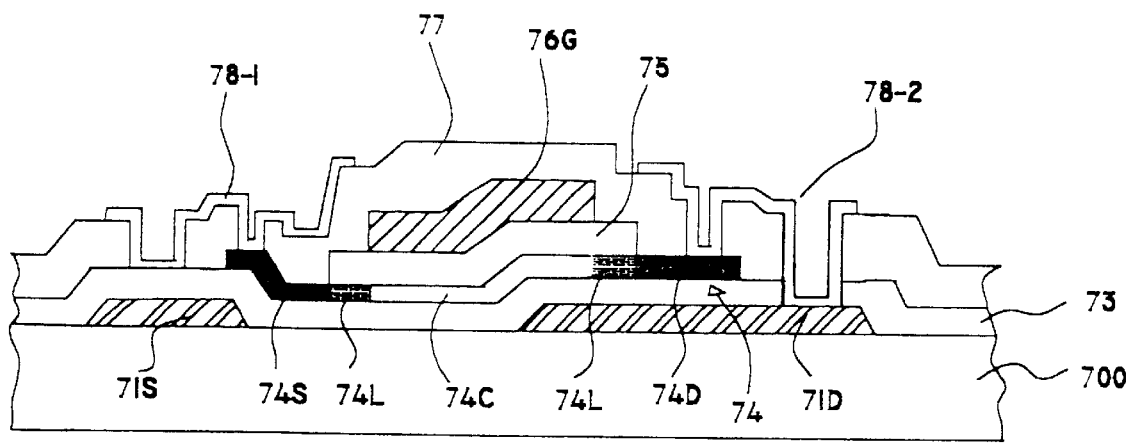
FIG. 5 shows a cross-sectional view of a TFT according to a fifth embodiment of the present invention.
Figure 6:
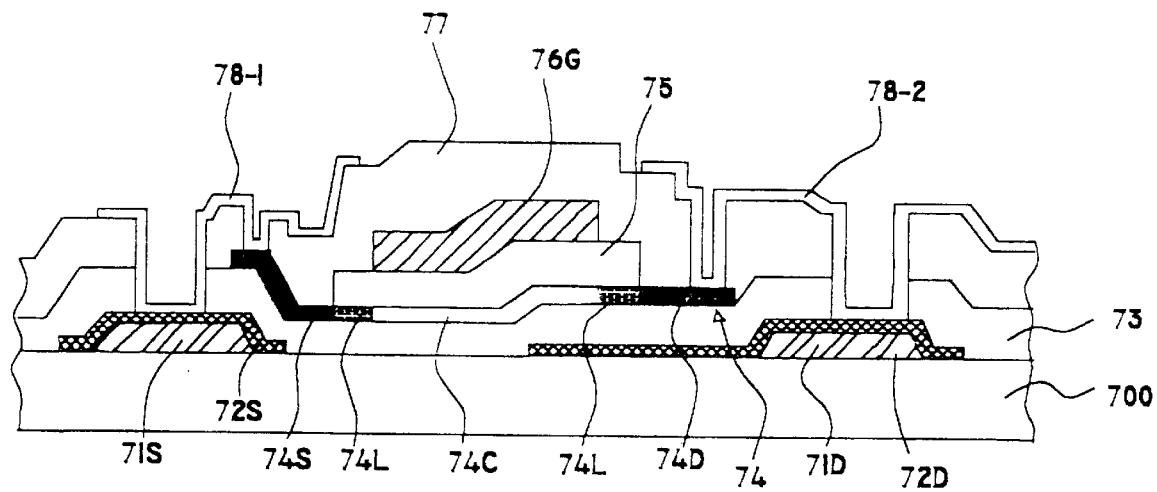
FIG. 6 shows a cross-sectional view of a TFT according to a sixth embodiment of the present invention.

FIG. 5 and FIG. 6 show cross-sectional views of TFTs according to fifth and sixth embodiments of the present invention, respectively. FIG. 5 shows a cross-sectional view of a TFT according to a fifth embodiment of the present invention wherein the TFT of a BBC structure has double gates.

Referring to FIG. 5, in the structure of the present invention, the electric field of a drain region is weakened by placing an extended drain electrode under a drain region because the degradation of the device characteristics, which is caused by hot carriers, is concentrated in the drain region. Thus, the reliability of the device is improved.

A source electrode 71S and a drain electrode 71D which is extended and underlies the drain region 74D are formed on an insulated substrate 700, and a first insulating layer 73 covers an exposed surface of the substrate. A channel region 74C, LD regions 74L and source and drain regions 74S and 74D, which are formed with polycrystalline silicon, are formed on predetermined parts of the first insulating layer 73 which functions as a gate insulating layer.

A gate insulating layer 75 and a gate electrode 76 are formed on an active layer 74. The gate insulating layer 75 is overlapped with the LD regions 74L and the channel region 74C in the active layer, while the gate electrode 76G on the gate insulating layer 75 lies over the channel region 74C in the active layer 74. The gate insulating layer 75 functions as an upper gate insulating layer.

A passivation layer 77 covers the entire surface of the structure. Contact holes exposing the source and drain electrodes 71S and 71D and the source and drain regions 74S and 74D in the active layer are formed through the buffer layer 73 and the passivation layer 77. On the passivation layer 75, a first interconnection wire 78-1 connecting the source electrode 71S to the source region 74S and a second interconnection wire 78-2 connecting the drain electrode 71D and to the drain region 74D are formed.

The degradation of the device characteristics, which is caused by hot carriers, is concentrated on the drain region. Thus, electric field of the drain region is weakened by placing an extended drain electrode 71D that underlies the drain region, which eliminates the need for an extra lower gate electrode.

A space for connecting the upper gate electrode to the lower is not required when the TFT of the above structure is fabricated as a driver. The above structure not only prevents the degradation of device characteristics but also reduces the area occupied by the circuits. The structure prevents the degradation of device characteristics, because the space for connecting two gates to each other for the prevention of the device degradation is saved.

FIG. 6 shows a cross-sectional view of a TFT according to a sixth embodiment of the present invention, which is transformed from the fifth embodiment of the present invention. Referring to FIG. 6, source and drain electrodes are formed with double layers on a substrate, which is the clad structure. This structure is used for source and drain electrodes which are formed with Al and have low electrical resistance.

A double-layered source electrode of the clad structure, in which the second source electrode 72S covers the first source electrode 71S, a double-layered drain electrode of the clad structure, in which the second drain electrode 72D covers the first drain electrode 71D are formed on a substrate 700. In this case, the second drain electrode 72D is extended to underlie the drain region 74D.

When the electrodes having at least two layers are formed at too great a thickness on the substrate 700, it is easy for the active layer on the buffer layer 73 to be electrically open at a step region due to the step height of the buffer layer 73 formed on the electrodes. Accordingly, the silicon layer on the step is vulnerable to being cut off during the deposition and crystallization of the amorphous silicon layer on the buffer layer.

Accordingly, as shown in FIG. 6, it is desirable to lessen the step height of the buffer layer 73 in part by forming a single-layered lower gate electrode instead of the double-layered type used for the source and drain electrodes.

FIG. 9A to FIG. 9D show cross-sectional views of fabricating a liquid crystal display according to the present invention, wherein the structure of the TFT shown in the first embodiment is a driver.

An LCD according to the present invention uses the TFT structure explained in the above description of the present invention for a driver to increase its driving speed and also uses LD TFTs to reduce the off-current for a pixel array. Accordingly, the LCD of the present invention improves on-current and device reliance by using the TFTs of the above LD structure according to the present invention in a driver and reduces leakage current by using the TFTs of the related art in a pixel array.

The structures of TFTs in a driver and a pixel array have been described in the first embodiment of the present invention and the description of a related art, respectively. Therefore, a structure of an LCD according to the present invention will not be repeated here.

Referring to FIG. 9A, after a first conductive layer has been deposited on a substrate 900 by a conventional deposition method, source, drain and lower gate electrodes 91S, 91D and 91G for a TFT in a pixel array and source, drain and lower gate electrodes 91'S, 91'D and 91'G for a TFT in a driver are preferably formed by photolithography.

Then, a buffer layer 92 is deposited on an exposed surface of a substrate by a conventional deposition method. In this case, the buffer layer 92 in a TFT of the BBC structure is formed to electrically insulate the electrodes of the source, a drain and lower gate, which are formed directly on the substrate 900, from the other components that lie over the electrodes.

An amorphous silicon layer is deposited on the exposed buffer layer 92. Then, the amorphous layer is crystallized by laser annealing. In this case, the buffer layer 92 prevents the silicon layer from being penetrated by impurities in the substrate 900 thereunder during the crystallization of the amorphous silicon layer and functions to thermally insulate the substrate from the silicon layer. Therefore, it is desirable to form the buffer layer 92 at a thickness greater than about 1000 angstroms. Then, an active layer 93 in the pixel array and the other active layer 93' in the driver are formed on the buffer layer 92 by photolithographically patterning the crystallized silicon layer.

Referring to FIG. 9B, a gate insulating layer and a second conductive layer are deposited successively on the entire surface of the substrate. A photoresist pattern PR for forming an upper gate electrode is defined on the second conductive layer. Then, an upper gate electrode 95G is formed by over-etching the second conductive layer beneath the photoresist pattern, which is used as an etch mask. Next, the gate insulating layer 25 is preferably anisotropically etched using the photoresist pattern PR as an etch mask again to form the gate insulating layers 94 and 94' in the pixel array and the driver, respectively.

Figure 9C:
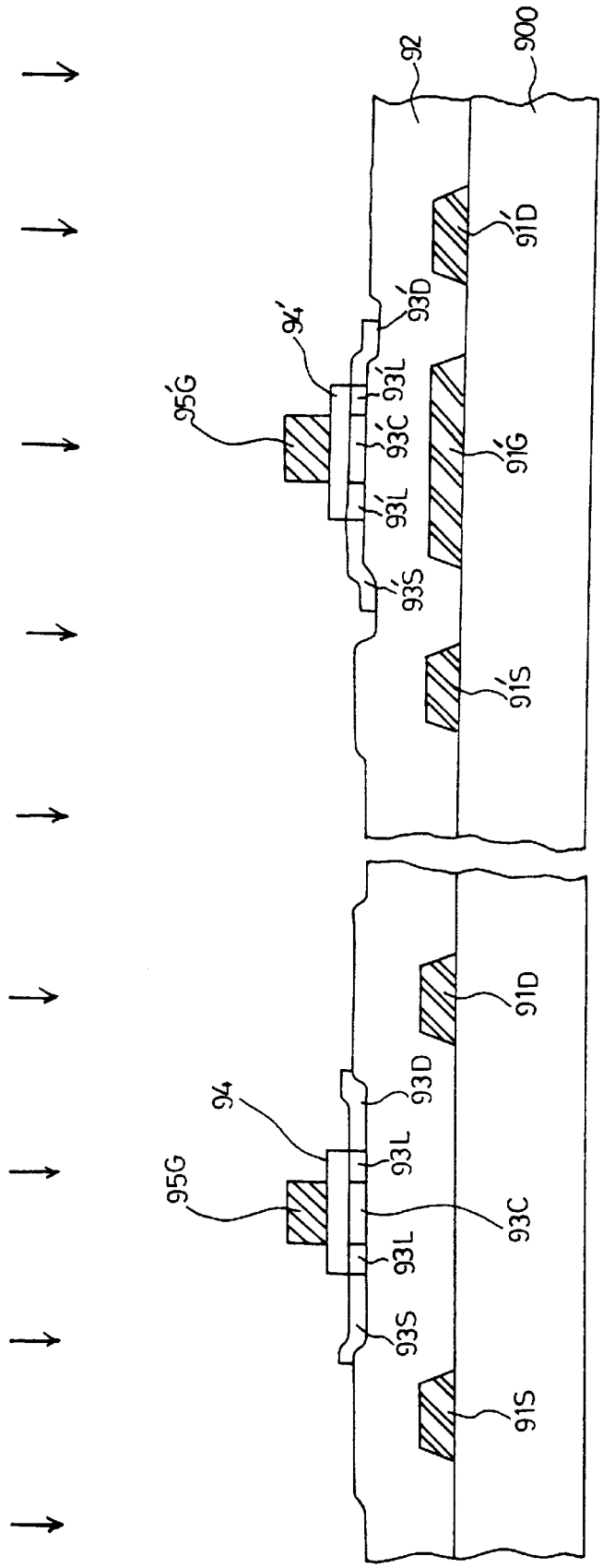

Referring to FIG. 9C, source, drain and LD regions 94S, 94D and 94L in the pixel array and the other source, drain and LDD regions 94'S, 94'D and 94'L in the driver are formed simultaneously by doping the active layers 94 and 94', respectively, with n- or p-type impurities. Sizes of the LDD regions in the active layers are decided by the width difference between the over-etched upper gate electrode and the gate insulating layer. In this case, provided that the TFTs in the driver are designed to form a CMOS structure, a first TFT is formed by n- (or p-) type impurities and a second TFT by p- (or n-) type impurities, respectively.

Figure 9D:
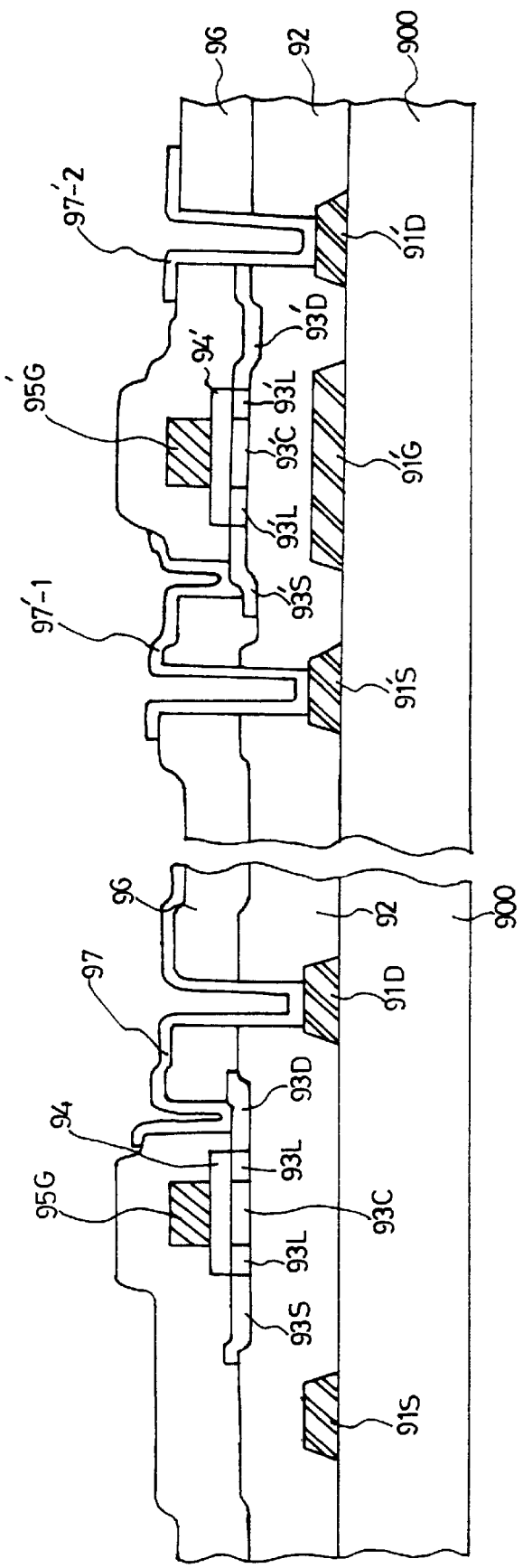

Referring to FIG. 9D, a passivation layer 96 covering the entire surface of the substrate is formed. Then, contact holes exposing the source electrode 91S, the source region 93S, the drain electrode 91D and the drain region 93D in the driver and the source electrode 91'S, the source region 93'S, the drain electrode 91'D and the drain region 93'D in the driver are formed by photolithographically patterning and etching the gate insulating layers 94 and 94' and the passivation layer 97.

A transparent conductive layer is deposited on the entire structure. A first interconnection wire 97'-1 which connects the source electrode 91'S to the source region 93'S in the driver and connects the drain electrode 91D to the drain region 93D in the pixel array and a second interconnection wire 97'-2 which connects the drain electrode 91'D to the drain region 93'D are formed by photolithographically patterning and etching the transparent conductive layer.

In this case, provided that TFTs in the driver are going to form a CMOS structure, the interconnection wires are formed to connect an n-type TFT to a p-type TFT to complete the CMOS structure and vice versa.

As explained in the above description, source and drain electrodes formed in an LCD according to the present invention do not require the additional step of the related art, because only a lower gate electrode is added to the whole process. Without an additional mask or an additional step, the present invention allows the formation of LD TFTs in a pixel array and TFTs of double gates in a driver.

The present invention adds a double gate structure to a TFT of a BBC structure having LD regions. Accordingly, resistance in the LD regions where carriers are induced by the lower gate electrode is reduced. Thus, the operating speed of the driver is increased by increasing on-current of the TFT.

Moreover, the electrical field around the drain moves downward because a channel is formed under the active layer by the lower gate electrode. Therefore, the electric field at the interface between the active layer and the gate insulating layer may be weakened so that the degradation of device characteristics by hot-carriers is inhibited.

The present invention also provides a TFT which increases the operating speed of a driver and improves the reliance of the device without additional fabrication steps.

Furthermore, the LCD of the present invention improves on-current and device reliance by using the TFTs of the above LD structure according to the present invention in a driver and reduces leakage current by using the TFTs of the related art in a pixel array.

It will be apparent to those skilled in the art that various modifications and variations can be made in the thin film transistor and the fabricating method thereof of the present invention without departing from the spirit or scope of the inventions. Thus, it is intended that the present invention cover the modifications and variations of this invention provided they come within the scope of the appended claims and equivalents.

What is claimed is:

1. A thin film transistor, comprising:
   a substrate;
   a source electrode, a drain electrode and a lower gate electrode formed on the substrate;
   a buffer layer covering the source, drain and lower gate electrodes;
   an active layer formed on the buffer layer, wherein a source region, a drain region and a channel region are formed in the active layer;
   a gate insulating layer formed on the channel region; and
   an upper gate electrode formed on the gate insulating layer over the channel region.

2. The thin film transistor according to claim 1, further comprising:
   a passivation layer covering the upper gate electrode;
   a plurality of contact holes in the buffer and passivation layers, wherein the contact holes expose the source and drain electrodes and the source and drain regions;
   a first interconnection wire connecting the source electrode to the source region; and
   a second interconnection wire connecting the drain electrode to the drain region.

3. The thin film transistor according to claim 1, wherein the active layer includes a lightly-doped region.

4. The thin film transistor according to claim 3, wherein the gate insulating layer covers the lightly-doped region.

5. The thin film transistor according to claim 3, wherein the lower gate electrode is extended to underlie the channel and the lightly-doped regions.

6. The thin film transistor according to claim 3, wherein the lower gate electrode comprises two sub-gate electrodes, each of which underlies the lightly-doped region.

7. The thin film transistor according to claim 3, wherein each one of the source electrode and the drain electrode comprises double layers.

8. The thin film transistor according to claim 7, wherein each one of the source and drain electrodes has a clad structure in which an upper layer covers a lower layer.

9. The thin film transistor according to claim 8, wherein the lower layer of the source and drain electrodes is an Al layer and the upper layer of the source and drain electrodes is an Mo layer.

10. The thin film transistor according to claim 1, wherein each one of the source electrode and the drain electrode comprises double layers.

11. The thin film transistor according to claim 10, wherein each one of the source and drain electrodes has a clad structure in which an upper layer covers a lower layer.

12. The thin film transistor according to claim 11, wherein the lower layer of the source and drain electrodes is an Al layer and the upper layer of the source and drain electrodes is an Mo layer.

13. The thin film transistor according to claim 1, wherein the lower gate electrode is made of the same material as upper layers of the source and drain electrodes.

14. A thin film transistor, comprising:
   a substrate;
   a source electrode and a drain electrode formed on the substrate;
   a buffer layer covering an exposed surface of the substrate including the source and drain electrodes;
   an active layer having a source region, a drain region, lightly-doped regions and a channel region on the buffer layer, a lightly doped region juxtaposed to the drain region which is partially overlapping, but insulated from, the drain electrode;
   a gate insulating layer on the channel and lightly-doped regions; and
   an upper gate electrode on the gate insulating layer over the channel region.

15. The thin film transistor according to claim 14, further comprising:
   a passivation layer covering the upper gate electrode;
   a plurality of contact holes formed in the buffer and passivation layers, wherein the contact holes expose the source and drain electrodes and the source and drain regions;
   a first interconnection wire connecting the source electrode to the source region; and
   a second interconnection wire connecting the drain electrode to the drain region.

16. The thin film transistor according to claim 14, wherein the gate electrode partially overlays, but is insulated from, the drain electrode.

17. The thin film transistor according to claim 14, wherein each one of the source electrode and the drain electrode comprises double layers.

18. The thin film transistor according to claim 17, wherein each one of the source and drain electrodes has a structure in which an upper layer covers a lower layer.

19. The thin film transistor according to claim 18, wherein the lower layer is an Al layer and the upper layer is an Mo layer in the source and drain electrodes.

20. A liquid crystal display, comprising:
   a substrate;
   a first thin film transistor, the first thin film transistor comprising:
   a source electrode and a drain electrode on the substrate; a buffer layer covering an exposed surface of the substrate and the source and drain electrodes;
   an active layer on the buffer layer, wherein a source region, a drain region, lightly-doped regions and a channel region are formed in the active layer; and
   a gate insulating layer on the channel and lightly-doped regions; a gate electrode on the gate insulating layer over the channel region; a second thin film transistor, the second thin film transistor comprising:
   a source electrode, a drain electrode and a lower gate electrode on the substrate;
   a buffer layer covering an exposed surface of the substrate and the source, drain and lower gate electrodes;
   an active layer on a predetermined portion of the buffer layer, wherein a source region, a drain region, lightly-doped regions and a channel region are formed in the active layer; and
   a gate insulating layer on the channel and lightly-doped regions in the active layer; and an upper gate electrode on the gate insulating layer over the channel region.

21. The liquid crystal display of claim 20, further comprising:
   a passivation layer covering the first and second thin film transistors;
   a plurality of contact holes exposing the source and drain electrodes and the source and drain regions of the first and second thin film transistors, respectively;
   a pixel electrode connecting the drain electrode of the first thin film transistor to the drain region of the first thin film transistor;
   a first interconnection wire connecting the source electrode to the source region in the second thin film transistor; and
   a second interconnection wire connecting the drain electrode to the drain region of the second thin film transistor.

22. The liquid crystal display according to claim 21, wherein the pixel electrode and the first and second interconnection wires are each made of the same material.

23. The liquid crystal display according to claim 20, wherein the buffer layer of the first thin film transistor is made of the same material as that of the buffer layer of the second thin film transistor, and wherein the buffer layers are formed from the same layer.

* * * * *